United States Patent
Shen et al.

(10) Patent No.: US 12,272,757 B2
(45) Date of Patent: Apr. 8, 2025

(54) UV-CURING OF LIGHT RECEIVING SURFACES OF SOLAR CELLS

(71) Applicants: Yu-Chen Shen, Sunnyvale, CA (US); Perine Jaffrenou, Mountain View, CA (US); Gilles Olav Tanguy Sylvain Poulain, Palaiseau (FR); Michael C. Johnson, Alameda, CA (US); Seung Bum Rim, Palo Alto, CA (US)

(72) Inventors: Yu-Chen Shen, Sunnyvale, CA (US); Perine Jaffrenou, Mountain View, CA (US); Gilles Olav Tanguy Sylvain Poulain, Palaiseau (FR); Michael C. Johnson, Alameda, CA (US); Seung Bum Rim, Palo Alto, CA (US)

(73) Assignee: Maxeon Solar Pte. Ltd., Singapore (SG)

(*) Notice: Subject to any disclaimer, the term of this patent is extended or adjusted under 35 U.S.C. 154(b) by 0 days.

(21) Appl. No.: 18/433,475

(22) Filed: Feb. 6, 2024

(65) Prior Publication Data
US 2024/0290894 A1    Aug. 29, 2024

Related U.S. Application Data

(63) Continuation of application No. 17/829,152, filed on May 31, 2022, now abandoned.

(51) Int. Cl.
| | | |
|---|---|---|
| H01L 31/18 | (2006.01) | |
| H01L 31/0216 | (2014.01) | |
| H01L 31/0236 | (2006.01) | |
| H01L 31/068 | (2012.01) | |
| H01L 31/0747 | (2012.01) | |

(52) U.S. Cl.
CPC .. *H01L 31/02168* (2013.01); *H01L 31/02167* (2013.01); *H01L 31/02363* (2013.01); *H01L 31/068* (2013.01); *H01L 31/0747* (2013.01); *H01L 31/186* (2013.01); *H01L 31/1864* (2013.01); *Y02E 10/547* (2013.01)

(58) Field of Classification Search
CPC ............ H01L 31/02168; H01L 31/186; H01L 31/02363; H01L 31/068; H01L 31/02167; H01L 31/0747; H01L 31/1864
See application file for complete search history.

(56) References Cited

U.S. PATENT DOCUMENTS

| | | | |
|---|---|---|---|
| 4,751,191 A * | 6/1988 | Gonsiorawski ... | H01L 31/02168 136/258 |
| 6,091,021 A * | 7/2000 | Ruby ................ | H01L 31/02167 136/255 |

(Continued)

*Primary Examiner* — Earl N Taylor
(74) *Attorney, Agent, or Firm* — Vanguard/IP LLP; Reginald Ratliff (57) ABSTRACT

Methods of fabricating solar cells using UV-curing of light-receiving surfaces of the solar cells, and the resulting solar cells, are described herein. In an example, a method of fabricating a solar cell includes forming a passivating dielectric layer on a light-receiving surface of a silicon substrate. The method also includes forming an anti-reflective coating (ARC) layer below the passivating dielectric layer. The method also includes exposing the ARC layer to ultra-violet (UV) radiation. The method also includes, subsequent to exposing the ARC layer to ultra-violet (UV) radiation, thermally annealing the ARC layer.

19 Claims, 6 Drawing Sheets

(56) References Cited

U.S. PATENT DOCUMENTS

| | | | |
|---|---|---|---|
| 8,450,594 B2* | 5/2013 | Varaprasad | C03C 17/3417 427/595 |
| 9,050,623 B1* | 6/2015 | Varadarajan | H01L 21/67115 |
| 9,190,556 B2* | 11/2015 | Wenham | H01L 31/186 |
| 2006/0269731 A1* | 11/2006 | Yoshikawa | B32B 17/10018 359/359 |
| 2007/0169808 A1* | 7/2007 | Kherani | H01L 31/022441 136/258 |
| 2009/0025777 A1* | 1/2009 | Varaprasad | C03C 17/02 427/595 |
| 2009/0151784 A1* | 6/2009 | Luan | H01L 31/02366 438/69 |
| 2010/0024874 A1* | 2/2010 | Varaprasad | H02S 40/10 427/508 |
| 2011/0027935 A1* | 2/2011 | Yang | H01L 31/0322 438/69 |
| 2011/0056545 A1* | 3/2011 | Ji | H01L 31/0747 136/255 |
| 2011/0240105 A1* | 10/2011 | Luan | H01L 31/02168 257/E31.119 |
| 2012/0171804 A1* | 7/2012 | Moslehi | H01L 31/18 257/E31.13 |
| 2013/0164879 A1* | 6/2013 | Cousins | H01L 31/1804 257/E31.13 |
| 2014/0083498 A1* | 3/2014 | Lee | H01L 31/068 438/57 |
| 2015/0007881 A1* | 1/2015 | Khadilkar | H01L 31/02167 252/512 |
| 2015/0050771 A1* | 2/2015 | Sharma | H01L 31/186 438/72 |
| 2015/0380581 A1* | 12/2015 | Johnson | H01L 31/0747 136/258 |
| 2018/0138328 A1* | 5/2018 | Shen | H01L 31/186 |
| 2018/0138354 A1* | 5/2018 | Jaffrennou | H01L 31/02168 |
| 2019/0137676 A1* | 5/2019 | Nam | C08L 83/04 |
| 2020/0111924 A1* | 4/2020 | Shen | H01L 31/186 |
| 2022/0293801 A1* | 9/2022 | Shen | H01L 31/0747 |

* cited by examiner

UV-CURING OF LIGHT RECEIVING SURFACES OF SOLAR CELLS

CROSS REFERENCE TO RELATED APPLICATIONS

This application is a continuation of U.S. patent application Ser. No. 17/829,152, filed on May 31, 2022, which is a Divisional of U.S. patent application Ser. No. 16/704,983, filed on Dec. 5, 2019, which is a Divisional of U.S. patent application Ser. No. 15/349,944, filed on Nov. 11, 2016, the entire contents of which are hereby incorporated by reference herein.

TECHNICAL FIELD

Embodiments of the present disclosure are in the field of renewable energy and, in particular, UV-curing of light-receiving surfaces of solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

BRIEF DESCRIPTION OF THE DRAWINGS

FIGS. 1A-1F illustrate cross-sectional views of various stages in the fabrication of a solar cell, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard"

describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

Methods of fabricating solar cells using UV-curing of light-receiving surfaces of the solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be appreciated that the various embodiments shown in the figures are illustrative representations and are not necessarily drawn to scale.

Disclosed herein are methods of fabricating solar cells. In one embodiment, a method of fabricating a solar cell includes forming a passivating dielectric layer on a light-receiving surface of a silicon substrate. The method also includes forming an anti-reflective coating (ARC) layer below the passivating dielectric layer. The method also includes exposing the ARC layer to ultra-violet (UV) radiation. The method also includes, subsequent to exposing the ARC layer to ultra-violet (UV) radiation, thermally annealing the ARC layer.

In another embodiment, a method of fabricating a solar cell includes forming a passivating dielectric layer on a light-receiving surface of a silicon substrate. The method also includes forming an anti-reflective coating (ARC) layer below the passivating dielectric layer. The method also includes increasing the saturation current density ($J_o$) at an interface at the light-receiving surface of the silicon substrate. The method also includes, subsequent to increasing the saturation current density, thermally annealing the ARC layer.

Also disclosed herein are solar cells. In one embodiment, a solar cell includes a passivating dielectric layer on a light-receiving surface of a silicon substrate. An anti-reflective coating (ARC) layer is disposed below the passivating dielectric layer. The ARC layer is an ultra-violet (UV) radiation-cured and thermally annealed ARC layer.

One or more embodiments described herein are directed to approaches for achieving improved front surface field (FSF) performance for solar cells. One or more embodiments, when implemented, improve the UV performance of the solar cell.

To provide context, light induced degradation (LID) and/or ultra-violet (UV) degradation pose long standing issues for the long term stability of solar cell performance. Efforts have been made to improve the stability of such solar cells without compromising performance in the form of decreased passivation or solar spectrum absorption (e.g., Jsc loss). Performance stability may be critical for performance guarantees and for product quality differentiation. More particularly, front surface passivation can be critical for performance of high efficiency solar cells. Typically, front surface passivation is performed using a diffusion process followed by a high temperature oxidation and, finally, capping with an antireflection coating (ARC) using plasma-enhanced chemical vapor deposition (PECVD). Silicon nitride (SiN or SIN:H) is commonly used as an ARC due to its optical properties and also for its excellent passivation qualities. A silicon nitride layer may be used to provide H+ to a crystalline silicon/thermal oxide (c-Si/TOX) interface. Unfortunately, the interface can be degraded by long term exposure to UV light via hot electron injection across the interface which breaks existing Si—H bonds. The hot electron can be trapped in the subsequent layers and be re-excited to bounce back and forth across the interface, which is a process known as interface wear.

Addressing one or more of the above issues, in accordance with one or more embodiments described herein, efficiency and reliability of a solar cell are improved by performing a UV-curing operation. In one exemplary embodiment, the UV curing operation may be performed prior to back end processing of a back contact solar cell.

Not to be bound by theory, in an embodiment, improved stability achieved by intentional UV treatment and thermal anneal results in a more energetically favorable Si—O bonding scenario. Additionally, such treatment may reduce the total number of O—H bonds at the surface of the underlying thermal oxide, reducing the amount of trap states for hot electron trapping and resulting in decreased interface wear.

FIGS. 1A-1F illustrate cross-sectional views of various stages in the fabrication of a solar cell, in accordance with an embodiment of the present disclosure. FIG. 2 is a flowchart listing operations in a method of fabricating a solar cell as corresponding to FIGS. 1A-1F, in accordance with an embodiment of the present disclosure.

Figure 1A:
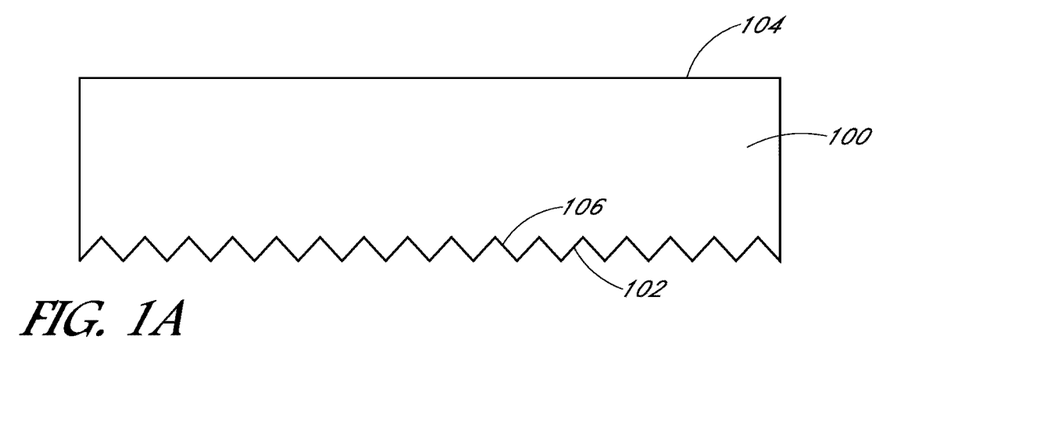
FIG. 1A illustrates a starting substrate of a solar cell.
Figure 2:
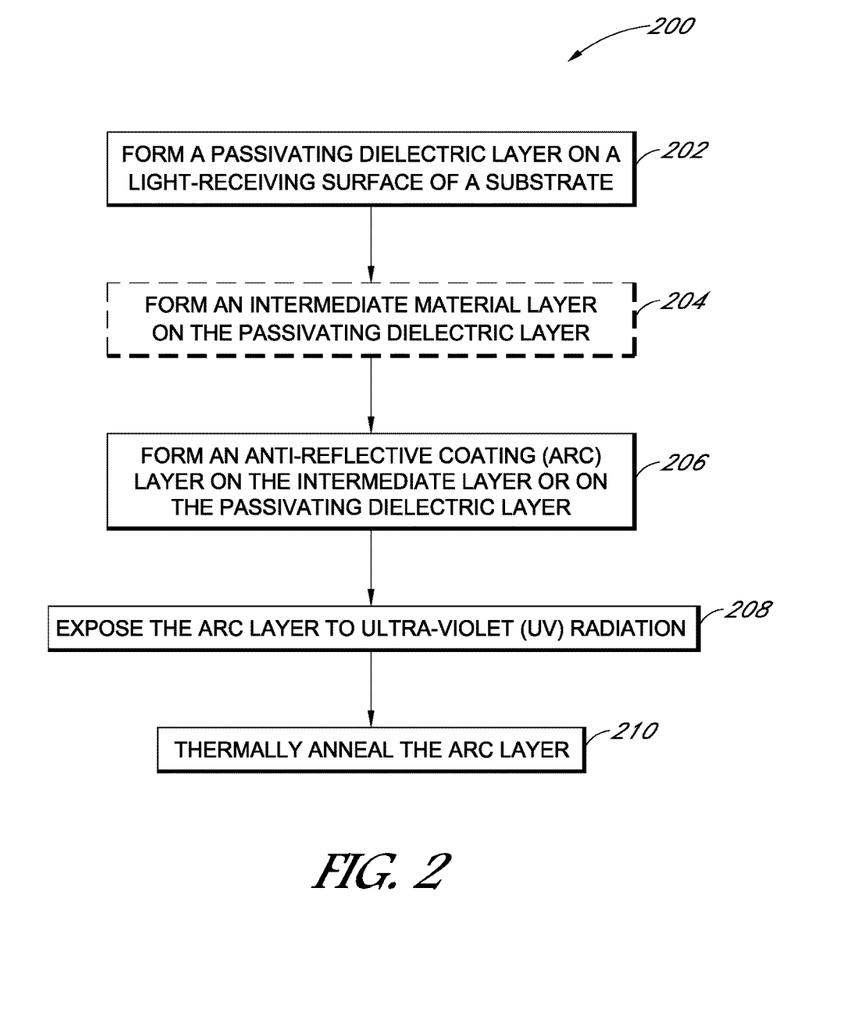
FIG. 2 is a flowchart listing operations in a method of fabricating a solar cell as corresponding to FIGS. 1A-1F, in accordance with an embodiment of the present disclosure.

FIG. 1A illustrates a starting substrate of a solar cell. Referring to FIG. 1A, substrate 100 has a light-receiving surface 102 and a back surface 104. In an embodiment, the substrate 100 is a monocrystalline silicon substrate, such as a bulk single crystalline N-type doped silicon substrate. It is to be appreciated, however, that substrate 100 may be a layer, such as a multi-crystalline silicon layer, disposed on a global solar cell substrate. In an embodiment, the light-receiving surface 102 has a texturized topography 106. In one such embodiment, a hydroxide-based wet etchant is employed to texturize the front surface of the substrate 100. It is to be appreciated that a texturized surface may be one which has a regular or an irregular shaped surface for scattering incoming light, decreasing the amount of light reflected off of the light-receiving surfaces of the solar cell.

Figure 1B:
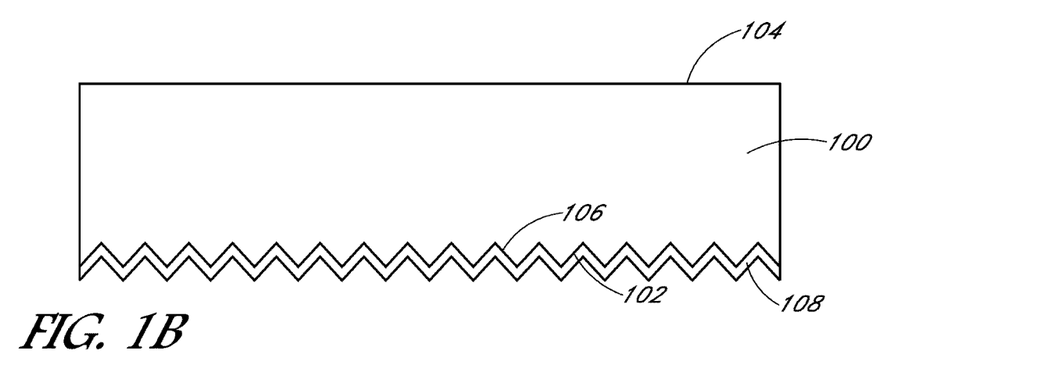
FIG. 1B illustrates the structure of FIG. 1A following formation of a passivating dielectric layer on a light-receiving surface of the substrate.

FIG. 1B illustrates the structure of FIG. 1A following formation of a passivating dielectric layer on a light-receiving surface of the substrate. Referring to FIG. 1B and corresponding operation 202 of flowchart 200, a passivating dielectric layer 108 is formed on the light-receiving surface 102 of substrate 100. In one embodiment, the light-receiving surface 102 has a texturized topography 106, and the passivating dielectric layer 108 is conformal with the texturized topography 106, as is depicted in FIG. 1B.

In an embodiment, the passivating dielectric layer 108 is a layer of silicon dioxide ($SiO_2$). In one such embodiment, the layer of silicon dioxide ($SiO_2$) has a thickness approximately in the range of 10-400 Angstroms. In one embodiment, the passivating dielectric layer 108 is hydrophilic. In an embodiment, the passivating dielectric layer 108 is formed by a technique such as, but not limited to, chemical oxidation of a portion of the light-receiving surface of the silicon substrate, plasma-enhanced chemical vapor deposition (PECVD) of silicon dioxide ($SiO_2$), thermal oxidation of a portion of the light-receiving surface of the silicon substrate, atomic layer deposition (ALD) of $SiO_2$, or exposure of the light-receiving surface of the silicon substrate to ultra-violet (UV) radiation in an $O_2$ or $O_3$ environment. In a specific embodiment, the passivating dielectric layer 108 is a thermal silicon oxide layer formed on the light-receiving surface of an N-type monocrystalline silicon substrate. In another specific embodiment, the passivating dielectric layer 108 is formed by atomic layer deposition (ALD), and is a silicon oxide passivating dielectric layer.

Figure 1C:
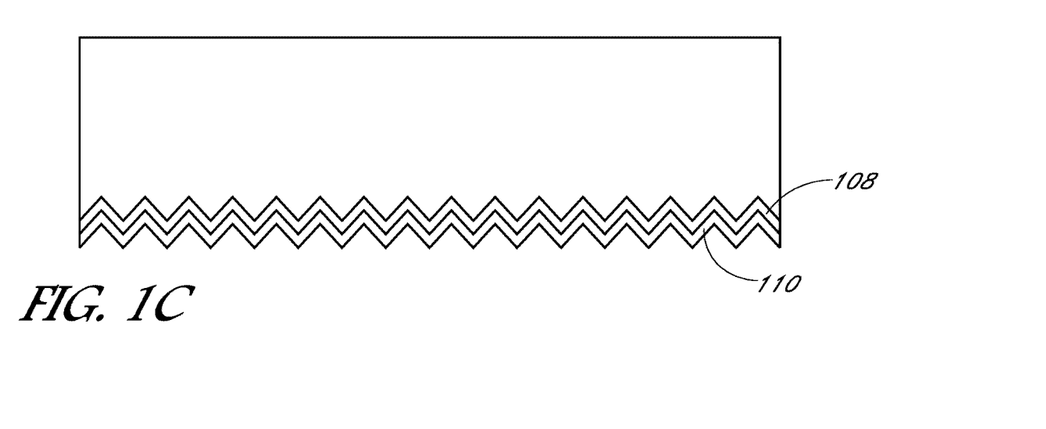
FIG. 1C illustrates the structure of FIG. 1B following optional formation of an intermediate material layer on the passivating dielectric layer.

FIG. 1C illustrates the structure of FIG. 1B following optional formation of an intermediate material layer on the passivating dielectric layer. Referring to FIG. 1C and corresponding optional operation 204 of flowchart 200, an intermediate material layer (or layers) 110 is formed on the passivating dielectric layer 108. In one embodiment, as is depicted in FIG. 1C, the intermediate material layer (or layers) 110 is conformal with the texturized topography 106.

In an embodiment, the intermediate material layer (or layers) 110 is or includes an N-type micro- or poly-crystalline silicon layer formed on the passivating dielectric layer 108. In one such embodiment, the N-type micro- or poly-crystalline silicon layer has a thickness approximately in the range of 1-20 nanometers. In one embodiment, the N-type micro- or poly-crystalline silicon layer has a crystalline fraction approximately in the range of 0.1-0.9 (i.e., 10-90%), with the balance being amorphous. In an embodiment, a concentration of N-type dopants (e.g., phosphorous) in the N-type micro- or poly-crystalline silicon layer is approximately in the range of 1E17–1E20 atoms/$cm^3$. In one embodiment, the N-type micro- or poly-crystalline silicon layer includes small grains having a micro- or nano-diameter. The small grains may be embedded in a generally amorphous silicon matrix and have essentially no long range order. In an embodiment, the N-type dopants are included in the amorphous portion, in the crystalline portion, or both.

In an embodiment, the N-type micro- or poly-crystalline silicon layer is formed by depositing an N-type amorphous silicon layer and, subsequently, phase converting the N-type amorphous silicon layer to the N-type micro- or poly-crystalline silicon layer. In one such embodiment, the N-type amorphous silicon layer is formed by a deposition process such as, but not limited to, plasma-enhanced chemical vapor deposition (PECVD), low pressure chemical vapor deposition (LPCVD), or sputtering (physical vapor deposition, PVD). In one embodiment, the phase conversion is achieved using a technique such as, but not limited to, heating in a furnace, rapid thermal processing (RTP), laser annealing, or forming gas annealing (FGA). In another embodiment, the N-type micro- or poly-crystalline silicon layer is formed by depositing the N-type micro- or poly-crystalline silicon layer. In one such embodiment, the N-type micro- or poly-crystalline silicon layer is deposited using PECVD.

In another embodiment, the intermediate material layer (or layers) 110 is or includes an N-type amorphous silicon layer. In one embodiment, forming the N-type amorphous silicon layer is performed at a temperature less than approximately 400 degrees Celsius. In an embodiment, the N-type amorphous silicon layer is formed using plasma enhanced chemical vapor deposition (PECVD), represented by phosphorous-doped a-Si:H, which includes Si—H covalent bonds throughout the layer. In either case, in an embodiment, the N-type micro- or poly-crystalline or amorphous silicon layer 112 includes an impurity such as phosphorous dopants. In one such embodiment, the phosphorous dopants are incorporated either during film deposition or in a post implantation operation.

In another embodiment, the intermediate material layer (or layers) 110 is or includes a layer such as, but not limited to, an amorphous silicon (a-Si) layer, a silicon-rich silicon nitride layer, or a Group III-V material layer. In one embodiment where the intermediate material layer (or layers) 110 is or includes a Group III-V material layer, the Group III-V material layer is a layer such as, but not limited to, a GaP layer, an AlGaP layer, a GaAs layer, an InGaAs layer, a GaN layer, or an AlGaN layer.

Figure 1D:
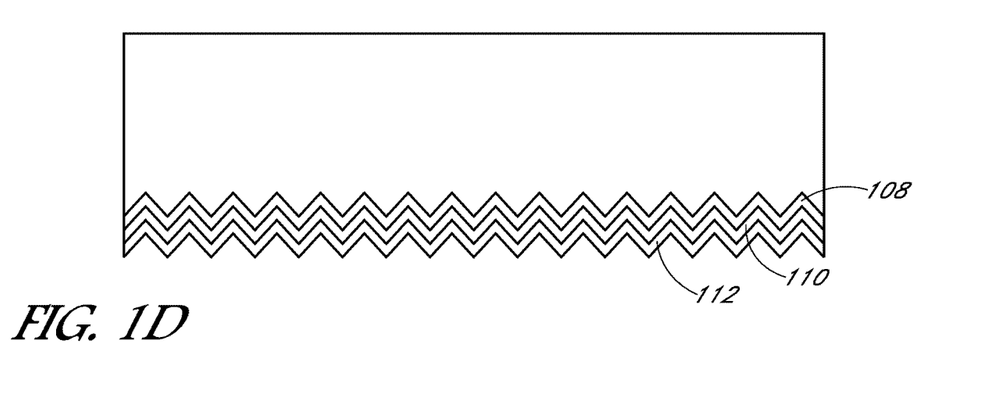
FIG. 1D illustrates the structure of FIG. 1C following formation of an anti-reflective coating (ARC) layer on the intermediate material layer.

FIG. 1D illustrates the structure of FIG. 1C following formation of an anti-reflective coating (ARC) layer on the optional intermediate material layer. Referring to FIG. 1D and corresponding operation 206 of flowchart 200, an anti-reflective coating (ARC) layer 112 is formed on the intermediate material layer (or layers) 110. It is to be appreciated that the intermediate material layer (or layers) 110 may be omitted and, in one embodiment, the ARC layer 112 is formed directly on the passivating dielectric layer 108. In either case, in one embodiment, as is depicted in FIG. 1D, the ARC layer 112 is conformal with the texturized topography 106.

In an embodiment, the ARC layer 112 is a non-conductive ARC layer. In one such embodiment, the non-conductive ARC layer is or includes a silicon nitride layer. In a particular such embodiment, the silicon nitride is formed at a temperature less than approximately 400 degrees Celsius. In another such embodiment, the ARC layer 112 is or includes a layer of aluminum oxide ($AlO_x$). In another embodiment, the ARC layer 112 is a conductive ARC layer. In one such embodiment, the conductive ARC layer includes a layer of indium tin oxide (ITO).

In an embodiment, the ARC layer 112 is formed having an amount of hydrogen therein. In one such embodiment, the fabrication process further includes removing at least a portion of the amount of hydrogen from the ARC layer 112 after deposition of the ARC layer 112. In a specific such embodiment, the portion of the amount of hydrogen from the ARC layer 112 is removed during the thermal annealing process described below in association with FIG. 1F.

Figure 1E:
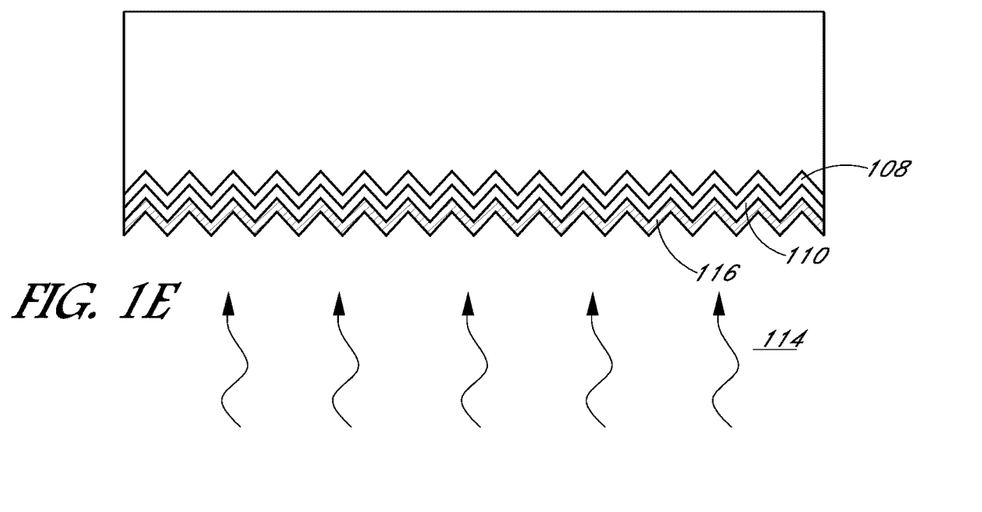
FIG. 1E illustrates the structure of FIG. 1D following exposure of the ARC layer to ultra-violet (UV) radiation.

FIG. 1E illustrates the structure of FIG. 1D following exposure of the ARC layer to ultra-violet (UV) radiation. Referring to FIG. 1E and corresponding operation 208 of flowchart 200, the ARC layer 112 is exposed to ultra-violet (UV) radiation 114. In an embodiment, the exposure of the ARC layer 112 to the UV radiation 114 forms a UV-cured ARC layer 116.

It is to be appreciated that although the exposure to ultra-violet (UV) radiation 114 is depicted herein as being performed following formation of the ARC layer 112, such a UV cure can be performed at other stages of the process flow. For example, in a first alternative embodiment, a UV cure is performed subsequent to forming the passivating dielectric layer 108 but prior to forming the ARC layer 112. In one such alternative embodiment, a UV cure is performed subsequent to forming the passivating dielectric layer 108 but prior to forming intermediate material layer (or layers) 110. In another such alternative embodiment, a UV cure is performed subsequent to forming the passivating dielectric layer 108 and forming intermediate material layer (or layers) 110.

In an embodiment, exposing the ARC layer 112 to UV radiation involves exposing the ARC layer 112 to light having a wavelength approximately in the range of 250-450 nanometers. In an embodiment, exposing the ARC layer 112 to UV radiation involves exposing the ARC layer 112 to the UV radiation 114 for a duration approximately in the range of 1 second-1 day. In an embodiment, subsequent to forming the ARC layer 112 but prior to exposing the ARC layer 112 to the UV radiation 114, the solar cell is heated at a temperature approximately in the range of 200-500 degrees Celsius.

Figure 1F:
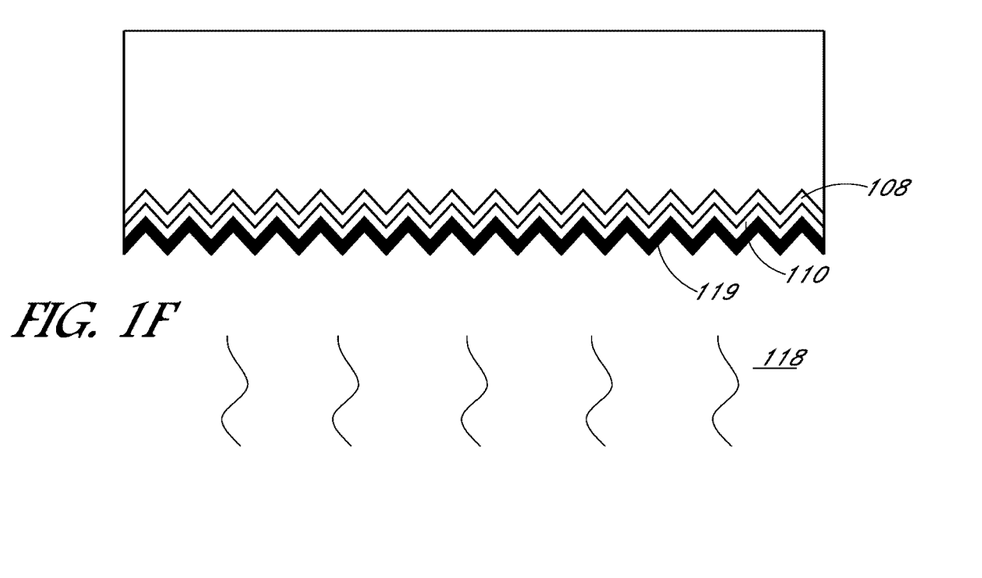
FIG. 1F illustrates the structure of FIG. 1E following thermal annealing of the ARC layer.

FIG. 1F illustrates the structure of FIG. 1E following thermal annealing of the ARC layer. Referring to FIG. 1F and corresponding operation 210 of flowchart 200, the UV-cured ARC layer 116 is thermally annealed, e.g., with thermal radiation 118. In an embodiment, the thermal annealing of the UV-cured ARC layer 116 forms a UV-cured and thermally annealed ARC layer 119.

In an embodiment, the ARC layer is thermally annealed by heating at a temperature approximately in the range of 200-500 degrees Celsius. In an embodiment, the ARC layer is thermally annealed using a process such as, but not limited to, a forming gas anneal (FGA) process, a rapid thermal anneal (RTA) process, an intra-red (IR) heating process, a furnace heating process, and a laser annealing process.

In accordance with an embodiment of the present disclosure, the thermal annealing is performed subsequent to curing the ARC layer using UV radiation exposure 114, as is depicted above. However, in an alternative embodiment, the thermal annealing is performed at substantially the same time as curing the ARC layer using UV radiation exposure 114.

It is to be appreciated that the above described nexus between the cross-sectional views of FIGS. 1A-1F and the flowchart of FIG. 2 is an exemplary embodiment of the method illustrated in the flowchart 200 of FIG. 2. However, embodiments of the flowchart 200 of FIG. 2 are not so limited.

Referring more generally to the flowchart 200 of FIG. 2, at operation 202, a method of fabricating a solar cell includes forming a passivating dielectric layer on a light-receiving surface of a substrate. At operation 206, the method also includes forming an anti-reflective coating (ARC) layer below the passivating dielectric layer. At operation 208, the method also includes exposing the ARC layer to ultra-violet (UV) radiation. At operation 210, the method also includes, subsequent to exposing the ARC layer to ultra-violet (UV) radiation, thermally annealing the ARC layer. In one embodiment, as depicted in operation 204 of flowchart 200, an intermediate material layer is formed on the passivating dielectric layer, and the ARC layer is formed on the intermediate material layer.

Figure 3:
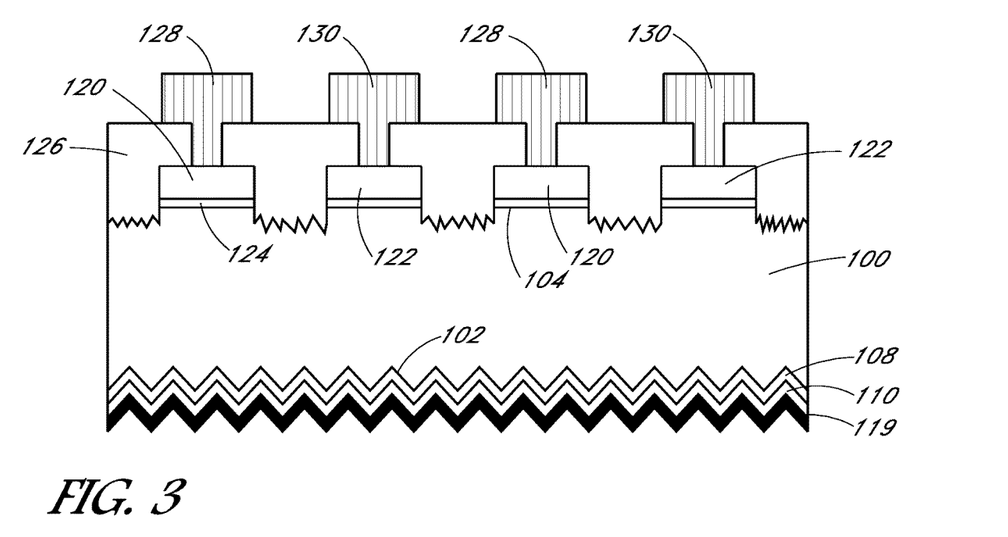
FIG. 3 illustrates a cross-sectional view of a back-contact solar cell having emitter regions formed above a back surface of a substrate and having a UV-cured and thermally annealed ARC layer at a light-receiving surface of the substrate, in accordance with an embodiment of the present disclosure.

FIG. 3 illustrates a cross-sectional view of a back-contact solar cell having emitter regions formed above a back surface of a substrate and having a UV-cured and thermally annealed ARC layer at a light-receiving surface of the substrate, in accordance with an embodiment of the present disclosure.

Referring to FIG. 3, a solar cell includes a silicon substrate 100 having a light-receiving surface 102. A passivating dielectric layer 108 is disposed on the light-receiving surface of the silicon substrate 100. An optional intermediate material layer (or layers) 110 is disposed on the passivating dielectric layer 108. An ARC layer 119 is disposed on the optional intermediate material layer (or layers) 110, as shown, or is disposed on the passivating dielectric layer 108. In one embodiment, the ARC layer 119 is a UV-radiation-cured and thermally annealed ARC layer. As such, the stack of layers on the light-receiving surface of the solar cell of FIG. 3 may be the same or substantially the same as described in association with FIG. 1A-1F.

Referring again to FIG. 3, on the back surface of the substrate 100, alternating P-type 120 and N-type 122 emitter regions are formed. In one such embodiment, trenches 121 are disposed between the alternating P-type 120 and N-type 122 emitter regions. More particularly, in an embodiment, first polycrystalline silicon emitter regions 122 are formed on a first portion of a thin dielectric layer 124 and are doped with an N-type impurity. Second polycrystalline silicon emitter regions 120 are formed on a second portion of the thin dielectric layer 124 and are doped with a P-type impurity. In an embodiment the tunnel dielectric 124 is a silicon oxide layer having a thickness of approximately 2 nanometers or less.

Referring again to FIG. 3, conductive contact structures 128/130 are fabricated by first depositing and patterning an insulating layer 126 to have openings and then forming one or more conductive layers in the openings. As described below, in an embodiment, the conductive contact structures 128/130 include metal and are formed by a deposition, lithographic, and etch approach or, alternatively, a printing or plating process or, alternatively, a foil or wire adhesion process.

Figure 4:
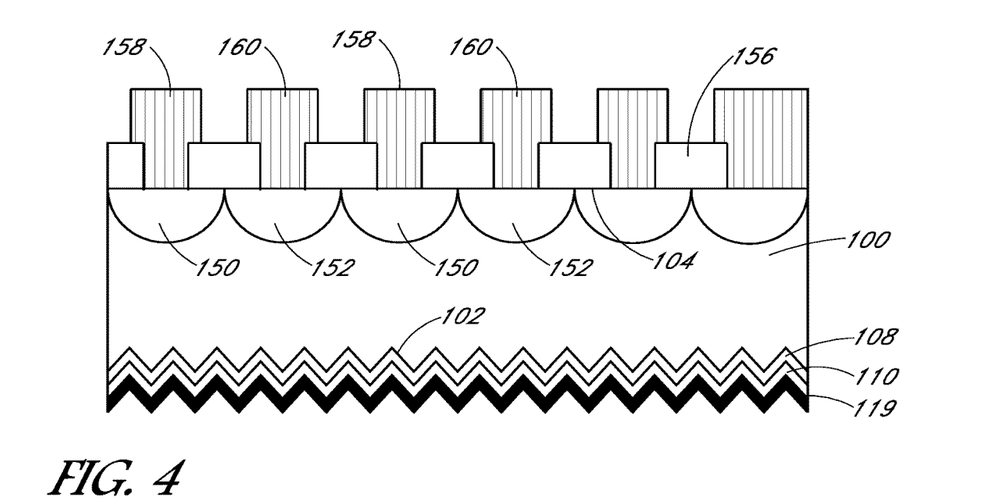
FIG. 4 illustrates a cross-sectional view of a back-contact solar cell having emitter regions formed in a back surface of a substrate and having a UV-cured and thermally annealed ARC layer at a light-receiving surface of the substrate, in accordance with an embodiment of the present disclosure.

FIG. 4 illustrates a cross-sectional view of a back-contact solar cell having emitter regions formed in a back surface of a substrate and having a UV-cured and thermally annealed ARC layer at a light-receiving surface of the substrate, in accordance with an embodiment of the present disclosure.

Referring to FIG. 4, a solar cell includes a silicon substrate 100 having a light-receiving surface 102. A passivating dielectric layer 108 is disposed on the light-receiving surface of the silicon substrate 100. An optional intermediate material layer (or layers) 110 is disposed on the passivating dielectric layer 108. An ARC layer 119 is disposed on the optional intermediate material layer (or layers) 110, as shown, or is disposed on the passivating dielectric layer 108. In one embodiment, the ARC layer 119 is a UV-radiation-cured and thermally annealed ARC layer. As such, the stack of layers on the light-receiving surface of the solar cell of FIG. 4 may be the same or substantially the same as described in association with FIG. 1A-1F.

Referring again to FIG. 4, within the back surface of the substrate 100, alternating P-type 150 and N-type 152 emitter regions are formed. More particularly, in an embodiment, first emitter regions 152 are formed within a first portion of substrate 100 and are doped with an N-type impurity. Second emitter regions 150 are formed within a second portion of substrate 100 and are doped with a P-type impurity. Referring again to FIG. 4, conductive contact structures 158/160 are fabricated by first depositing and patterning an insulating layer 156 to have openings and then forming one or more conductive layers in the openings. As described below, in an embodiment, the conductive contact structures 158/160 include metal and are formed by a deposition, lithographic, and etch approach or, alternatively, a printing or plating process or, alternatively, a foil or wire adhesion process.

Referring to FIGS. 3 and 4, in an embodiment, the fabrication of the conductive contacts 128/130 or 158/160 involves the inclusion of one or more sputtered, plated or bonded conductive layers. In an embodiment, the conductive contacts 128/130 or 158/160 are formed by first forming a metal seed layer on the exposed portions of the alternating P-type 120 and N-type 122 emitter regions or the alternating P-type 150 and N-type 152 emitter regions. In one such embodiment, a mask is first formed to expose only select portions of the alternating P-type 120 and N-type 122 emitter regions or the alternating P-type 150 and N-type 152 emitter regions in order to direct the metal seed layer formation to restricted locations.

In an embodiment, the metal seed layer is an aluminum-based metal seed layer. In an embodiment, the metal seed layer includes a layer having a thickness approximately in the range of 0.05 to 20 microns and includes aluminum in an amount greater than approximately 90 atomic %. In an embodiment, the metal seed layer is deposited as a blanket layer which is later patterned, e.g., thus using a deposition, lithographic, and etch approach. In another embodiment, the metal seed layer is deposited as patterned layer. In one such embodiment, the patterned metal seed layer is deposited by printing the patterned metal seed layer.

In an embodiment, contact formation further includes forming a metal layer by plating on the metal seed layer to form the conductive contacts 128/130 or 158/160. In an embodiment, the metal layer is a copper layer. Accordingly, in an embodiment, the conductive contacts 128/130 or 158/160 are formed by first forming a metal seed layer and then performing an electroplating process.

In another embodiment, the conductive contacts 128/130 or 158/160 are formed by printing a paste. The paste may be composed of a solvent and the aluminum/silicon (Al/Si) alloy particles. A subsequent electroplating or electroless-plating process may then be performed. The paste may be formed in addition to, or in place of, the metal seed layer.

In another embodiment, the conductive contacts 128/130 or 158/160 are formed by first forming the metal seed layer and then adhering a metal foil layer to the metal seed layer. In one such embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil is welded to the metal seed layer. The metal foil may subsequently be patterned, e.g., by laser ablation and/or etching.

In another embodiment, a metal wire is formed on the metal seed layer. In one such embodiment, the wire is an aluminum (Al) or copper (Cu) wire. In an embodiment, the metal wire is welded to the metal seed layer.

Figure 5:
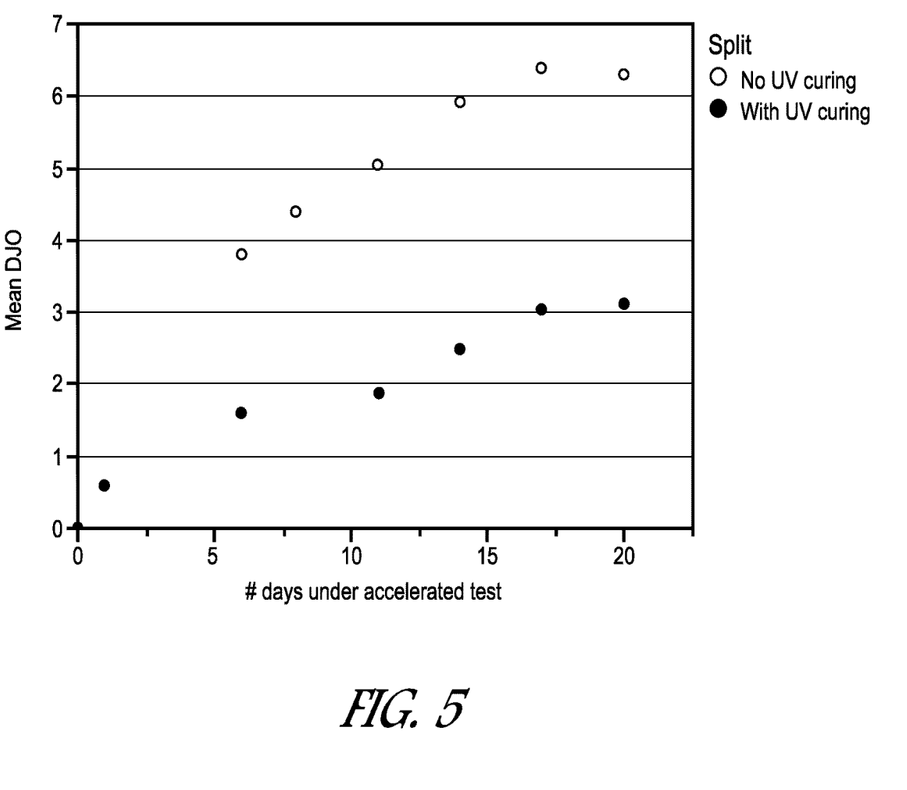
FIG. 5 is a plot demonstrating UV stability for samples having undergone a UV cure versus samples not having undergone a UV cure, in accordance with an embodiment of the present disclosure.

In another aspect, in accordance with an embodiment of the present disclosure, a UV cure intentionally implemented prior to an anneal process provides for layer UV stability in the field, where the UV cure intentionally provides the stability. Thus, solar cell performance may be improved through the inclusion of a UV cure process. As an example, FIG. 5 is a plot demonstrating UV stability for samples having undergone a UV cure using an Hg ARC lamp (broad band spectrum, which includes a portion of UVA/UVB) versus samples not having undergone a UV cure, in accordance with an embodiment of the present disclosure. In one such embodiment, the observed improved UV stability is provided as a result of within-wafer uniformity improvement. It is to be appreciated that the metrics used involve the degradation in passivation (DJ0) under accelerated UV degradation tests (where 28 days is equivalent to about 1 year).

Figure 6:
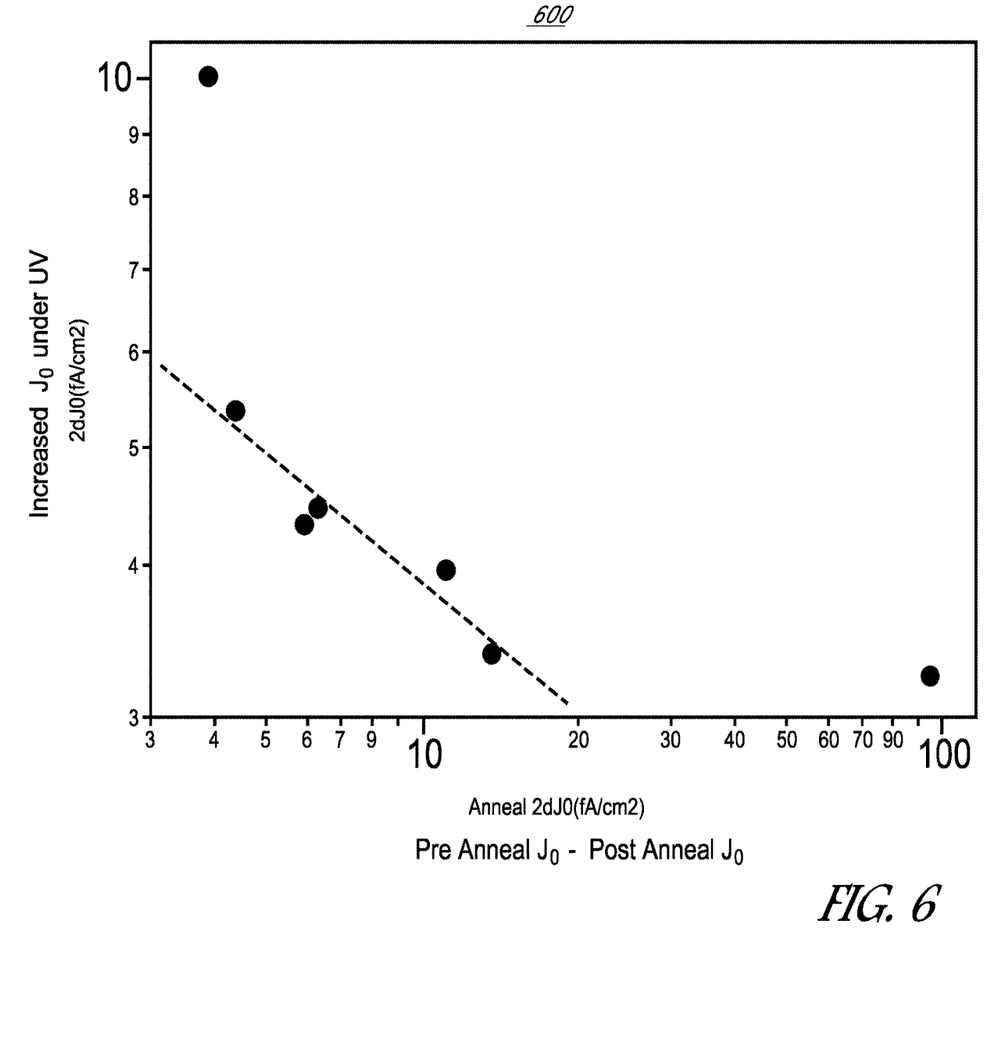
FIG. 6 is a plot demonstrating that higher $J_0$ prior to anneal provides improved UV stability, in accordance with an embodiment of the present disclosure.

In an embodiment, achieving high saturation current density ($J_O$) prior to an annealing operation provides improved UV stability for a solar cell. As an example, FIG. 6 is a plot 600 demonstrating that higher $J_O$ prior to anneal provides improved UV stability, in accordance with an embodiment of the present disclosure. Referring to plot 600, the higher pre anneal $J_O$, the lower delta $J_O$ under UV. If pre anneal $J_O$ is approximately 15 fA/cm$^2$ higher than anneal $J_O$, at 1 week under accelerated UV degradation tests UV delta $J_O$ is less than 4 fA/cm$^2$. The result is an approximately 50% improved stability as compared to a control sample. Thus, in one embodiment, a UV cure process is implemented to increase $J_O$ before anneal, leading to improved UV stability.

Accordingly, in an embodiment, a solar cell fabrication process includes implementation of a UV cure process to increase $J_O$ prior to an anneal operation. In one such embodiment, the UV cure increases one or more of the saturation current density ($J_O$), the surface recombination velocity, or the interface trap density at an interface of the light-receiving surface of a silicon substrate. In a specific embodiment, such a UV cure is performed after forming an anti-reflective coating (ARC) layer below a passivating dielectric layer formed on the light-receiving surface of the silicon substrate. Subsequent to increasing the saturation current density, the ARC layer is thermally annealed.

In one embodiment, increasing the saturation current density at the interface involves exposing the ARC layer to UV radiation having a wavelength approximately in the range of 250-450 nanometers for a duration approximately in the range of 1 second-1 day. In one embodiment, thermally annealing the ARC layer involves heating at a temperature approximately in the range of 200-500 degrees Celsius using a process such as, but not limited to, a forming gas anneal (FGA) process, a rapid thermal anneal (RTA) process, an intra-red (IR) heating process, a furnace heating process, or a laser annealing process.

Referring again to FIGS. 1F, 3 and 4, in an embodiment, a solar cell includes a passivating dielectric layer 108 on a light-receiving surface of a silicon substrate. An anti-reflective coating (ARC) layer 119 is below the passivating dielectric layer. The ARC layer 119 is an ultra-violet (UV) radiation-cured and thermally annealed ARC layer. In one such embodiment, the solar cell further includes an intermediate material layer 110 disposed on the passivating dielectric layer 108. In a specific embodiment, the intermediate material layer 110 is a layer such as, but not limited to, an N-type micro-crystalline silicon layer, an N-type polycrystalline silicon layer, an amorphous silicon (a-Si) layer, a silicon-rich silicon nitride layer, or a Group III-V material layer (such as GaP, AlGaP, GaAs, InGaAs, GaN or AlGaN), and the ARC layer 119 is disposed on the intermediate material layer 110. In an embodiment, the intermediate material layer 110 is an ultra-violet (UV) radiation-cured and thermally annealed layer or stack of layers. In an embodiment, the passivating dielectric layer 108 is an ultra-violet (UV) radiation-cured and thermally annealed passivating dielectric layer.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be appreciated that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells or bi-facial architectures as well. It is also to be appreciated that both front side and back side surfaces of any such solar cells may benefit from a UV cure process. In other embodiments, the above described approaches can be applicable to manufacturing of other than solar cells. For example, manufacturing of light emitting diode (LEDs) may benefit from approaches described herein.

Furthermore, in an embodiment, a cluster plasma enhanced chemical vapor deposition (PECVD) tool can be used to combine many of the above described process operations in a single pass in a process tool. For example, in one such embodiment, up to four distinct PECVD operations and a UV-exposure and/or RTP operation can be performed in a single pass in a cluster tool. The PECVD operations can include depositions of one or more layers such as one or more of the above described passivating dielectric layer, intermediate material layer(s), and the ARC layer.

Thus, methods of fabricating solar cells using UV-curing of light-receiving surfaces of the solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   forming a passivating dielectric layer on a light-receiving surface of a silicon substrate;
   forming an anti-reflective coating (ARC) layer below the passivating dielectric layer;
   exposing the ARC layer to ultra-violet (UV) radiation to provide the solar cell with a pre anneal saturation current density (Jo);
   subsequent to forming the ARC layer and prior to exposing the ARC layer to UV radiation, heating at a temperature approximately in the range of 200-500 degrees Celsius; and
   subsequent to exposing the ARC layer to ultra-violet (UV) radiation, thermally annealing the ARC layer to provide the solar cell with an anneal Jo, wherein the pre anneal Jo is approximately 15 $fA/cm^2$ higher than the anneal Jo and, at 1 week under accelerated UV degradation test a UV delta Jo is less than 4 $fA/cm^2$.

2. The method of claim 1, wherein exposing the ARC layer to UV radiation comprises exposing the ARC layer to light having a wavelength approximately in the range of 250-450 nanometers.

3. The method of claim 1, wherein exposing the ARC layer to UV radiation comprises exposing for a duration approximately in the range of 1 second-1 day.

4. The method of claim 1, wherein thermally annealing the ARC layer comprises heating at a temperature approximately in the range of 200-500 degrees Celsius.

5. The method of claim 4, wherein the heating comprises using a process selected from the group consisting of a forming gas anneal (FGA) process, a rapid thermal anneal (RTA) process, an intra-red (IR) heating process, a furnace heating process, and a laser annealing process.

6. The method of claim 1, wherein forming the passivating dielectric layer comprises forming a thermal silicon oxide layer on a light-receiving surface of the silicon substrate, and wherein the silicon substrate is an N-type monocrystalline silicon substrate.

7. The method of claim 1, wherein forming the passivating dielectric layer comprises forming the passivating dielectric layer by atomic layer deposition (ALD), the passivating dielectric layer selected from the group consisting of silicon oxide.

8. The method of claim 1, wherein forming the ARC layer comprises forming a silicon nitride layer.

9. The method of claim 1, the method further comprising:
   subsequent to forming the passivating dielectric layer, forming an N-type micro- or poly-crystalline silicon layer on the passivating dielectric layer, wherein the ARC layer is formed on the N-type micro- or poly-crystalline silicon layer.

10. The method of claim 1, the method further comprising:
    subsequent to forming the passivating dielectric layer, forming an intermediate material layer on the passivating dielectric layer, the intermediate material layer selected from the group consisting of an amorphous silicon (a-Si) layer, a silicon-rich silicon nitride layer, and a Group III-V material layer, wherein the ARC layer is formed on the intermediate material layer.

11. The method of claim 1, wherein forming the ARC layer comprises forming the ARC layer having an amount of hydrogen therein, the method further comprising:
    removing at least a portion of the amount of hydrogen from the ARC layer.

12. The method of claim 11, wherein removing the at least a portion of the amount of hydrogen from the ARC layer is performed during the thermal annealing of the ARC layer.

13. The method of claim 1, wherein the ARC layer includes hydrogen.

14. The method of claim 1, wherein the exposing the ARC layer to UV radiation and the thermally annealing the ARC layer reduce hydrogen bonds at the interface between the ARC layer and the passivating dielectric layer.

15. The method of claim 1, wherein the ARC layer that is exposed to UV radiation includes silicon nitride, aluminum oxide or indium tin oxide.

16. The method of claim 1, wherein the passivating dielectric layer includes an oxide.

17. A method of fabricating a solar cell, the method comprising:
forming a passivating dielectric layer on a light-receiving surface of a silicon substrate;
forming an anti-reflective coating (ARC) layer below the passivating dielectric layer;
increasing the saturation current density (Jo) at an interface at the light-receiving surface of the silicon substrate, wherein increasing the saturation current density at the interface comprises exposing the ARC layer to UV radiation having a wavelength approximately in the range of 250-450 nanometers for a duration approximately in the range of 1 second-1 day to provide the solar cell with a pre anneal Jo;
subsequent to forming the ARC layer and prior to exposing the ARC layer to UV radiation, heating at a temperature approximately in the range of 200-500 degrees Celsius; and
subsequent to increasing the saturation current density, thermally annealing the ARC layer to provide the solar cell with an anneal Jo, wherein the pre anneal Jo is approximately 15 fA/cm$^2$ higher than the anneal Jo and, at 1 week under accelerated UV degradation test a UV delta Jo is less than 4 fA/cm$^2$.

18. The method of claim 17, wherein thermally annealing the ARC layer comprises heating at a temperature approximately in the range of 200-500 degrees Celsius using a process selected from the group consisting of a forming gas anneal (FGA) process, a rapid thermal anneal (RTA) process, an intra-red (IR) heating process, a furnace heating process, and a laser annealing process.

19. A method of fabricating a solar cell, the method comprising:
forming a thermal silicon oxide layer on a light-receiving surface of an N-type monocrystalline silicon substrate;
forming an anti-reflective coating (ARC) layer below the thermal silicon oxide layer;
increasing the saturation current density (Jo) at an interface at the light-receiving surface of the silicon substrate, wherein increasing the saturation current density at the interface comprises exposing the ARC layer to UV radiation having a wavelength approximately in the range of 250-450 nanometers for a duration approximately in the range of 1 second-1 day to provide the solar cell with a pre anneal Jo;
subsequent to forming the ARC layer and prior to exposing the ARC layer to UV radiation, heating at a temperature approximately in the range of 200-500 degrees Celsius; and
subsequent to increasing the saturation current density, thermally annealing the ARC layer to provide the solar cell with an anneal Jo, wherein the pre anneal Jo is approximately 15 fA/cm$^2$ higher than the anneal Jo and, at 1 week under accelerated UV degradation test a UV delta Jo is less than 4 fA/cm$^2$.

* * * * *